US009787310B2

(12) United States Patent
Yang et al.

(10) Patent No.: US 9,787,310 B2
(45) Date of Patent: Oct. 10, 2017

(54) LEVEL-SHIFTER CIRCUIT FOR LOW-INPUT VOLTAGES

(71) Applicant: Silicon Laboratories Inc., Austin, TX (US)

(72) Inventors: Chao Yang, Austin, TX (US); Praveen Kallam, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 54 days.

(21) Appl. No.: 14/574,134

(22) Filed: Dec. 17, 2014

(65) Prior Publication Data

US 2016/0182051 A1    Jun. 23, 2016

(51) Int. Cl.
*H03L 5/00* (2006.01)
*H03K 19/0185* (2006.01)

(52) U.S. Cl.
CPC .................. *H03K 19/018514* (2013.01)

(58) Field of Classification Search
None
See application file for complete search history.

(56) References Cited

U.S. PATENT DOCUMENTS

| 3,628,127 | A | 12/1971 | Waldhauer |
| 4,065,726 | A | 12/1977 | Senger |
| 4,970,413 | A | 11/1990 | Eden et al. |
| 5,223,751 | A | 6/1993 | Simmons et al. |
| 5,303,394 | A | 4/1994 | Hrncirik |
| 5,717,355 | A | 2/1998 | Martin |
| 5,818,280 | A | 10/1998 | Martin |
| 6,140,846 | A | 10/2000 | Chan et al. |
| 6,359,814 | B1 | 3/2002 | Sundaram et al. |
| 6,483,345 | B1 * | 11/2002 | Whittaker ........ H03K 19/01831 326/127 |
| 7,026,824 | B2 | 4/2006 | Chen |
| 7,183,832 | B1 * | 2/2007 | Voo ..................... H03F 3/45179 326/81 |
| 7,362,163 | B1 | 4/2008 | Raghavan |
| 7,375,575 | B1 | 5/2008 | Bazes |
| 7,489,178 | B2 | 2/2009 | Yeung |
| 7,511,552 | B2 | 3/2009 | Ali et al. |
| 7,511,553 | B2 | 3/2009 | Nuebling |
| 7,683,667 | B2 | 3/2010 | Kim |
| 7,683,668 | B1 | 3/2010 | Thakur et al. |
| 7,701,281 | B1 | 4/2010 | Raghavan |
| 7,737,757 | B2 | 6/2010 | Behrends et al. |
| 7,750,687 | B2 | 7/2010 | Muehlbacher et al. |
| 7,843,247 | B1 | 11/2010 | Bazes |
| 7,872,499 | B2 | 1/2011 | Tsuchi |

(Continued)

FOREIGN PATENT DOCUMENTS

EP      0778674      6/1997

*Primary Examiner* — Lincoln Donovan
*Assistant Examiner* — Khareem E Almo
(74) *Attorney, Agent, or Firm* — Cesari & Reed LLP; R. Michael Reed (57) ABSTRACT

In some embodiments, a method may include receiving an input signal at an input stage of a circuit and amplifying the input signal using an amplifier of the circuit to produce a level-shifted output signal. The method may further include selectively controlling switches of an active load coupled to the input stage based on the level-shifted output signal to turn off current flow between transitions in the input signal.

20 Claims, 4 Drawing Sheets

(56) References Cited

U.S. PATENT DOCUMENTS

| | | |
|---|---|---|
| 8,013,655 B2 | 9/2011 | Herzer et al. |
| 8,030,965 B2 | 10/2011 | Kojima |
| 8,203,373 B2 | 6/2012 | Herzer et al. |
| 8,218,378 B2 | 7/2012 | Arsovski et al. |
| 8,432,189 B1 | 4/2013 | Malhan et al. |
| 8,432,222 B2 | 4/2013 | Ivanov |
| 8,437,201 B2 | 5/2013 | Arsovski et al. |
| 8,525,570 B2 | 9/2013 | Ha et al. |
| 8,860,461 B2 | 10/2014 | Sofer et al. |
| 8,878,591 B2 | 11/2014 | Fang et al. |
| 2007/0236271 A1 | 10/2007 | Nuebling |
| 2008/0100342 A1 | 5/2008 | Muhlbacher et al. |
| 2010/0060561 A1* | 3/2010 | Deane .................. G09G 3/3677 345/100 |
| 2011/0140750 A1 | 6/2011 | Kojima |
| 2013/0128655 A1 | 5/2013 | Cheng et al. |
| 2014/0028371 A1 | 1/2014 | Fang et al. |
| 2014/0159795 A1 | 6/2014 | Scouten |

\* cited by examiner

LEVEL-SHIFTER CIRCUIT FOR LOW-INPUT VOLTAGES

FIELD

The present disclosure is generally related to level-shifter circuits for low-input voltages, and more particularly, to level-shifter circuits having low power consumption.

BACKGROUND

Many devices, such as portable computing devices, portable radios, and the like, may include integrated circuits that utilize low power supply voltages. In some circuits, an integrated circuit may include different power domains having different power levels. Such circuits may include a level-shifter circuit to pass signals from a lower voltage domain to a relatively higher voltage domain.

SUMMARY

In some embodiments, a method may include receiving an input signal at an input stage of a circuit and amplifying the input signal using an amplifier of the circuit to produce a level-shifted output signal. The method may further include selectively controlling switches of an active load coupled to the input stage based on the level-shifted output signal to turn off current flow between transitions in the input signal.

In other embodiments, a circuit may include an output node and may include an input stage including at least one input to receive an input signal, and including at least one output. The circuit may also include an active load coupled to the input stage and to the output node. The active load may be configured to selectively supply current to the input stage in response to transitions within the input signal and to disable current to the input stage between the transitions in the input signal.

In still other embodiments, a circuit may include a first output node and a second output node. The circuit may further include an input stage including at least one input to receive an input signal and including an output. The circuit may also include at least one converter circuit coupled to the output of the input stage. The converter circuit may include a first output coupled to the first output node and a second output coupled to the second output node. The circuit may further include an active load coupled to the input stage and may be responsive to signals at the first output node and the second output node to selectively disable current to the input stage.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of circuits and methods are described below that can level shift an input signal from less than 0.4 volts to 3.8 volts or even higher, which makes it possible to allow circuits to run at very low supply voltage levels to conserve power. Such low power platforms may be attractive for battery powered circuits, such as portable computing devices, portable radios, and other electronic devices. In some embodiments, the circuit may include at least one input to receive an input signal and may include a first output and a second output. In some embodiments, the circuit may include a dynamically configured active load that may be coupled to the first and second outputs. In some embodiments, the dynamically configured active load may include switches may selectively disable current flow through a portion of the circuit based on the voltages at the output to reduce overall current flow.

In some embodiments, the circuit may provide a level-shift circuit configured to provide a level shift function independent of p-channel metal oxide semiconductor field effect transistor (MOSFET) or n-channel MOSFET ratios. In some embodiments, since the circuit provides a ratio-less design, the transistors may be formed in a selected size to save area. In some embodiments, the circuit may be formed of high voltage devices, allowing for the omission of high voltage protection circuitry. In some embodiments, the circuit may be provided with low-voltage devices in conjunction with a cascode protection device in an input stage to achieve a faster response at low input voltages.

Figure 1:
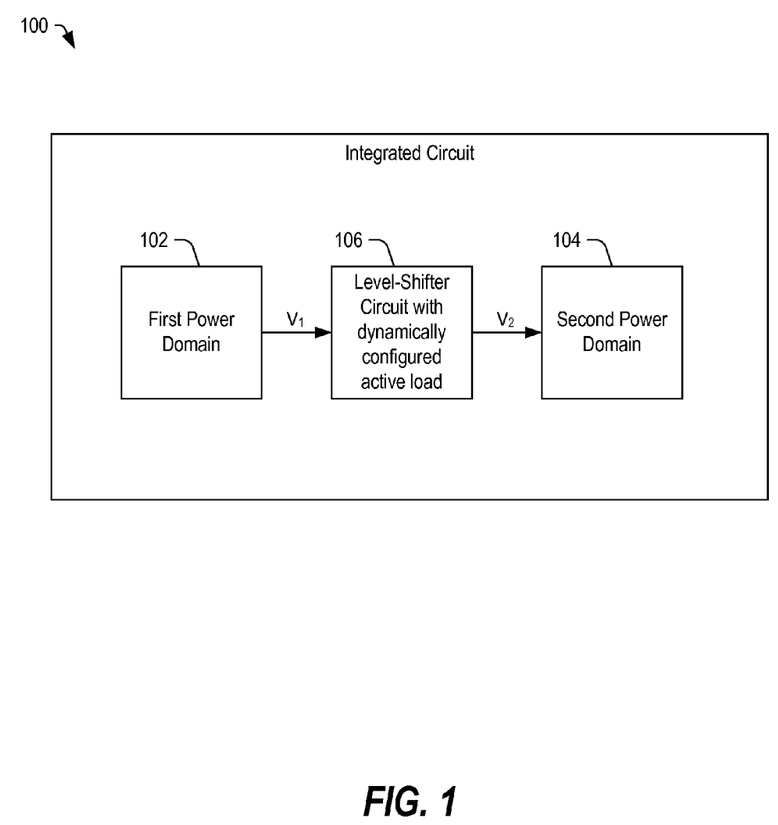
FIG. 1 is a block diagram of an integrated circuit including a level shifter having a dynamically configured active load, in accordance with certain embodiments.

FIG. 1 is a block diagram of an integrated circuit 100 including a level shifter 106 having a dynamically configured active load, in accordance with certain embodiments. The integrated circuit 100 may include a first power domain 102 and a second power domain 104. The level-shifter circuit 106 may be coupled to an output of the first power domain 102 to receive a first signal (such as a first voltage at a first voltage level), and may include an output to provide a second signal (such as a second voltage at a second voltage level). The output of the level-shifter circuit 106 may be coupled to an input of the second power domain 104.

In some embodiments, the level shifter 106 may be configured to level shift an input signal ($V_1$) to a higher voltage level. The level shifter 106 may shift a variety of input voltages, including voltages less than 0.4 volts (in some embodiments). In some embodiments, the level shifter 106 may include a current mirror circuit including a pair of switches having control inputs coupled to outputs of the level shifter 106 to receive a feedback signal. The switches may be configured to selectively disable current flow through the current mirror based on the feedback signal.

Figure 2:
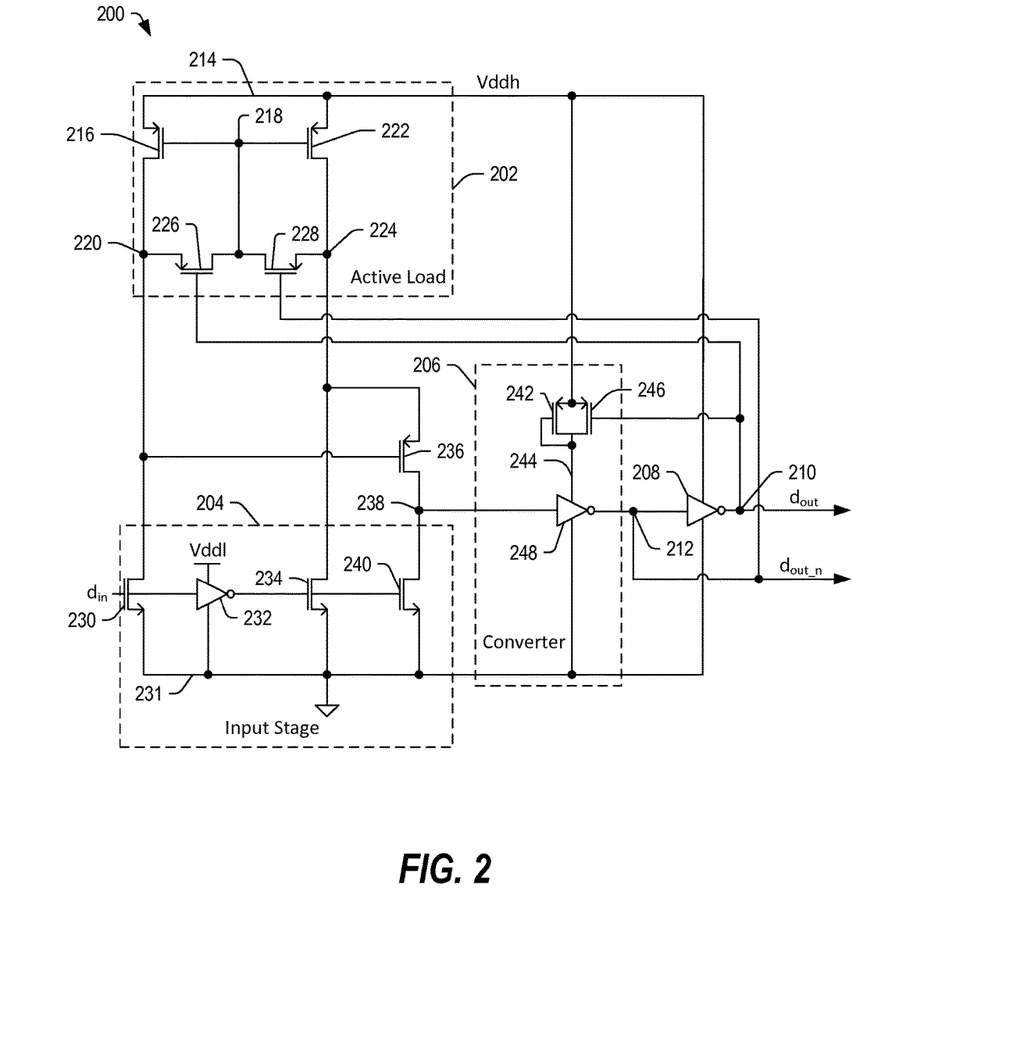
FIG. 2 is a diagram of a level-shifter circuit having a dynamically configured active load to adjust a level of a single-ended input, in accordance with certain embodiments.

FIG. 2 is a diagram of a level-shifter circuit 200 having a dynamically configured active load to adjust a level of a single-ended input, in accordance with certain embodiments. The level-shifter circuit 200 may be an example of the level-shifter circuit 106 in FIG. 1. The level-shifter circuit 200 may include an active load circuit 202 coupled to a first power supply node 214 (vddh). The active load circuit 202 may be dynamically configured based signals at a first output node 210 and a second output node 212 of the level-shifter circuit 200. The level-shifter circuit 200 may further include an input stage 204 coupled to the active load circuit 202 and coupled to a converter 206. The converter 206 may be coupled to the first power supply node 214, may be coupled to the first output through an inverter 208, and may be coupled to the second output.

In some embodiments, the active load circuit 202 may include a transistor 216 including a source coupled to the first power supply node 214, a gate coupled to a node 218, and a drain coupled to a node 220. The active load circuit 202 may further include a transistor 222 including a source coupled to the first power supply node 214, a gate coupled to the node 218, and a drain coupled to a node 224. The active load circuit 202 may also include a transistor 226 including a source coupled to the node 220, a gate coupled to the output node 210, and a drain coupled to the node 218. The active load circuit 202 may further include a transistor 228 including a source coupled to the node 224, a gate coupled to the output node 212, and drain coupled to the node 218.

The input stage 204 may include a transistor 230 including a drain coupled to the node 231, a gate to receive an input signal ($d_{in}$), and a source coupled to a second power supply node 231, such as ground. The input stage 204 may further include an inverter 232 including an input coupled to the gate of the transistor 230, a first supply input coupled to a low supply node (Vddl), a second supply input coupled to the node 231, and an output coupled to a gate of a transistor 234. The transistor 234 may further include a drain coupled to the node 224, and a source coupled to the second power supply node. The input stage 204 may further include a transistor 240 including a drain coupled to a node 238, a gate coupled to the gate of the transistor 234, and a source coupled to the second power supply node 231.

The level-shifter circuit 200 may include a transistor 236 including a source coupled to the node 224, a gate coupled to the node 220, and a drain coupled to the node 238. The node 238 may be coupled to an input of the converter 206. The converter 206 may include an inverter 248 having an input coupled to the node 238, a power input coupled to a node 244, a second power input coupled to the second power supply node 231, and an output coupled to the node 212. The converter 206 may further include a transistor 242 including a source coupled to the first power supply node 214, a gate coupled to the node 244, and a drain coupled to the node 244. The converter 206 may further include a transistor 246 including a source coupled to the power supply node 214, a gate coupled to the node 210, and drain coupled to the node 244. The level-shifter circuit 200 may include an inverter 208 including an input coupled to the node 212 and an output coupled to the node 210.

In some embodiments, the transistors 216, 222, 226, 228, 230, 234, and 240 form an amplifier that is PMOS/NMOS ratio independent. The differential output of the amplifier may be converted to a single ended output at the node 238, which toggles between zero volts and a power supply voltage minus a voltage threshold (vddh–vthp). The converter 206 level shifts the voltage at the node 238 to the power supply voltage level (vddh). The transistors 226 and 228 dynamically switch in response to the output voltages at the nodes 212 and 210, respectively, to eliminate static current, such that the active load consumes current during transitions, and then turns off.

In some embodiments, when the input signal ($d_{in}$) is at a low or zero voltage level, the transistor 230 may be turned off. The voltage at the node 220 may be approximately one voltage threshold (vth) below the voltage level of the supply node 214 (i.e., vth). Transistors 234 and 240 may be turned on and the voltages at the nodes 224 and 238 may be approximately equal to the voltage level of the power supply node 231 (i.e., ground). The voltage at the node 212 is approximately at vddh and the voltage at the node 210 is approximately ground. The transistor 226 may be turned on, and the transistor 228 may be turned off, diode coupling the transistor 216. However, since the transistor 230 is not conducting, there is no current flow through either of the transistors 216 and 222.

When the input signal at the gate of the transistor 230 transitions to a logic high level, the transistor 230 turns on, and current flows through the transistors 216 and 230. The transistor 222 turns on and mirrors the current flowing through the transistor 216. However, the transistors 234 and 240 are turned off. The voltage at the node 238 may rise to a level of approximately one voltage threshold drop (vth) below the supply voltage (i.e., vddh–vth). The converter 206 operates to restore the threshold drop voltage (vth) such that the voltage at node 212 is approximately a negative supply voltage (–vddh), and the inverter 208 operates to invert the voltage at node 212 to provide a positive supply voltage (vdd) at the output node 210. The negative voltage at the output node 212 turns on the transistor 228, while the high voltage on the output node 210 turns off the transistor 226. The dynamic switching of the transistors 226 and 228 removes the diode configuration of the transistor 216 and causes the transistor 222 to be diode connected. However, since the transistors 234 and 240 are turned off, and since there is no current flow through the inverter 248, there is no current flow through the transistor 222. Since the transistor 216 mirrors the transistor 222, there is no current flow through the transistor 216.

In some embodiments, the dynamic switching of the transistors 226 and 228 may reduce static current flow to ground when the input voltage is high. Similarly, when the input voltage is low, the transistor 230 is turned off, and dynamic switching of the transistors 226 and 228 turns off current flow through the transistor 222 because it mirrors the current flow through the transistor 216. Thus, the dynamic switching of the switches 226 and 228 operate to reduce or eliminate static current flow.

In some embodiments, the transistors 216, 222, 226, 228, 230, 234, 236, 240, 242, and 246 may be formed using low voltage transistors or small sized transistors. In some embodiments, the transistors 216, 222, 226, 228, 230, 234, 236, 240, 242, and 246 may be formed of a selected size to provide an overall circuit size that is comparable to a traditional design. In some embodiments, the transistors 230, 234, and 240 may be formed of high voltage devices such that voltage protection circuitry may be omitted. Due to the ratio-independent nature of the level-shifter circuit 200, the transistor sizes may be substantially the same.

In some embodiments, the transistors 226 and 228 may be replaced with CMOS switches. In a particular example, in addition to the PMOS transistor 226, an NMOS transistor (not shown) may be coupled in parallel. The NMOS transistor may include a source coupled to the node 220, a gate coupled to the node 212, and a drain coupled to the node 218. Similarly, in addition to the PMOS transistor 228, an NMOS transistor (not shown) may be coupled in parallel. The NMOS transistor may include a source coupled to the node 218, a gate coupled to the node 210, and a drain coupled to the node 224.

While the level-shifter circuit 200 in FIG. 2 was implemented as a single input device, it is also possible to implement a differential input level shifter that uses a dynamically configured active load to reduce current consumption. One possible example is described below with respect to FIG. 3.

Figure 3:
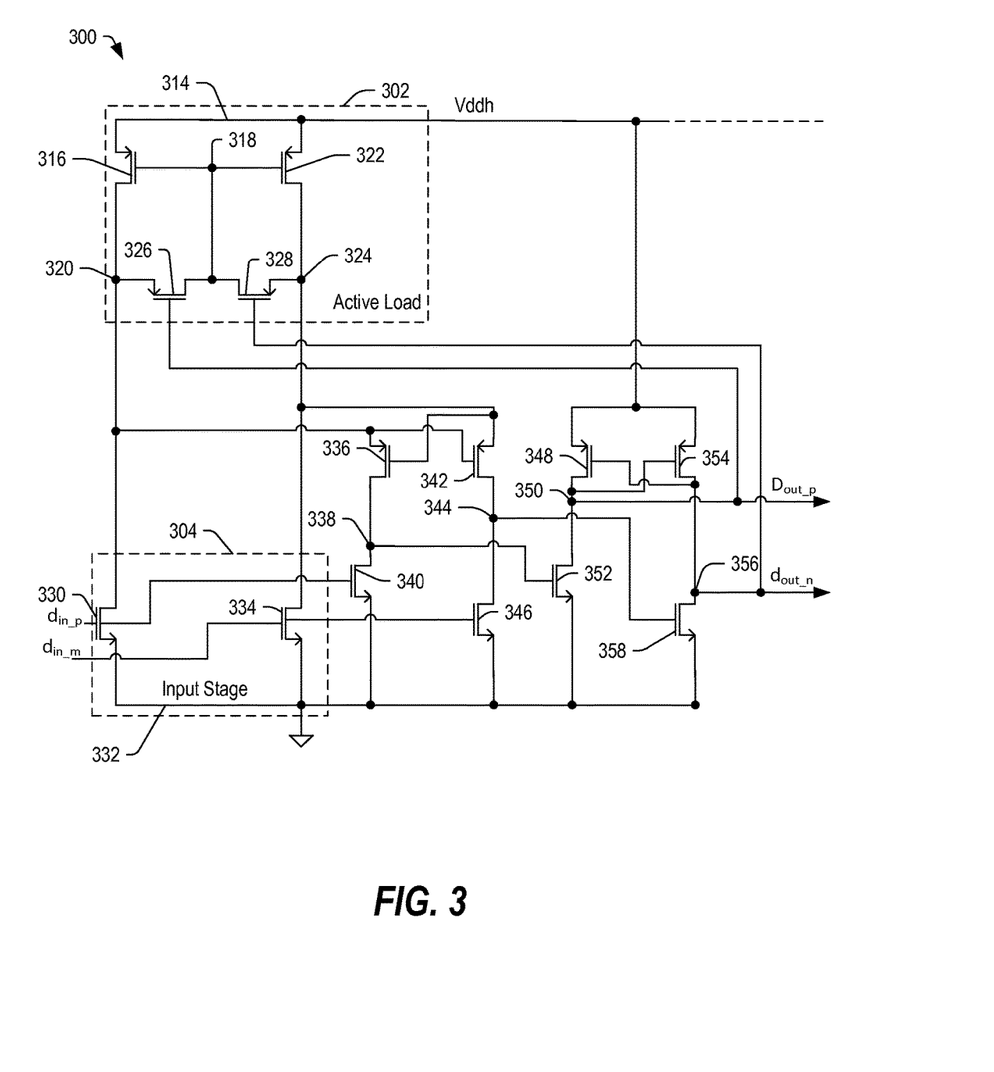
FIG. 3 is a diagram of a level-shifter circuit having a dynamically configured active load to adjust a level of a differential input, in accordance with certain embodiments.

FIG. 3 is a diagram of a level-shifter circuit 300 having a dynamically configured active load 302 to adjust a level of a differential input, in accordance with certain embodiments. The level-shifter circuit 300 may be an example of the level-shifter circuit 106 in FIG. 1. The level-shifter circuit 300 may include the dynamically configured active load 302 coupled to an input stage 304. The active load 302 may include a transistor 316 including a source coupled to a first power supply node 314 (such as a Vddh), a gate coupled to a node 318, and a drain coupled to a node 320. The active load may further include a transistor 322 including a source coupled to the node 314, a gate coupled to the node 318, and a drain coupled to a node 324. The active load 302 may also include a transistor 326 including a source coupled to the node 320, a gate coupled to an output node 350, and a drain coupled to the node 318. The active load 302 may further include a transistor 328 having a source coupled to the node 324, a gate coupled to a node 356, and a drain coupled to the node 318.

The input stage 304 may include a transistor 330 including a drain coupled to the node 320, a gate configured to receive a positive input ($d_{in\_p}$), and a source coupled to a second power supply node 332 (such as ground). The input stage 304 may also include a transistor 334 including a drain coupled to the node 324, a gate configured to receive a negative input ($d_{in\_m}$), and a source coupled to the node 332.

The level-shifter circuit 300 may further include a transistor 336 including a source coupled to the node 320, a gate coupled to the node 324, and a drain coupled to a the node 338. The level-shifter circuit 300 may also include a transistor 340 including a drain coupled to the node 338, a gate coupled the node 320, and a source coupled to the node 332. The level-shifter circuit 300 may further include a transistor 342 including a source coupled to the node 324, a gate coupled to the node 320, and a drain coupled to the node 344. The level-shifter circuit 300 may also include a transistor 346 including a drain coupled to the node 344, a gate coupled to the node 324, and a source coupled to the node 332.

The level-shifter circuit 300 may also include a transistor 348 including a source coupled to the node 314, a gate coupled to a node 356, and a drain coupled to the ode 350. The level-shifter circuit 300 may further include a transistor 352 including a drain coupled to the node 350, a gate coupled to the node 338, and a source coupled to the node 332. The level-shifter circuit 300 may include a transistor 354 including a source coupled to the node 314, a gate coupled to the node 350, and a drain coupled to the node 356. The level-shifter circuit 300 may further include a transistor 358 including a drain coupled to the node 356, a gate coupled to the node 344, and a source coupled to the node 332.

In some embodiments, the transistors 336, 340, 342, and 346 cooperate to provide a first conversion stage, and the transistors 348, 352, 354, and 356 cooperate to provide a second conversion stage. The first and second stages operate to level shift the signal to provide a signal range at the output that corresponds to approximately a rail-to-rail swing.

In some embodiments, when the voltage at the gate of the transistor 330 is high, the voltage at the gate of the transistor 334 is low. In this state, the transistor 330 is turned on, and the transistor 334 is turned off. The transistor 340 is turned on because it is coupled to the gate of the transistor 330, and the transistor 346 is turned off because its gate is coupled to the gate of the transistor 334. Since the transistor 330 is turned on, the voltage at the node 320 is pulled down to a level that is one voltage threshold (vth) above ground. Since the transistor 334 is turned off, the voltage at the node 324 rises to a level that is approximately Vddh. Since the voltage at the node 320 is low, the transistor 342 is on; however, the transistor 336 is turned off. The transistor 340 is turned on and pulls the voltage at the node 338 low, while the voltage at the node 344 rises to approximately vddh–vth. The inverting amplifier formed by transistors 348, 352, 354, and 358 may cooperate to invert and scale the signals at the nodes 338 and 344 to provide output signals at the nodes 350 and 356 that have a range from Vdd to ground.

The zero voltage on the node 356 turns on the transistor 328, placing the transistor 322 in a diode configuration. At the same time, the high voltage on the node 350 turns off the transistor 326. Since the transistor 334 is turned off, there is no current flow through the transistor 322. Further, since current flow through the transistor 322 is mirrored through the transistor 316, no current flows through the transistor 316. Thus, the active load circuit 302 operates to reduce overall current consumption.

In some embodiments, the dynamically configured active load 302 prevents or eliminates static current flow. In some embodiments, the voltage at the output nodes 350 and 356 control the transistors 326 and 328, respectively, to selectively configure one of the transistors 316 and 322 into a diode configuration. In a particular example, when the transistor 326 is turned on, the transistor 328 is turned off. In this configuration, the transistor 316 may be in a diode configuration, while the gate of the transistor 322 is decoupled from its drain. Conversely, when the transistor 328 is turned on and the transistor 326 is turned off, the transistor 322 may be in a diode configuration and the gate of the transistor 316 is decoupled from its drain.

In some embodiments, the transistors 326 and 328 may be replaced with CMOS switches. In a particular example, in addition to the PMOS transistor 326, an NMOS transistor (not shown) may be coupled in parallel. The NMOS transistor may include a source coupled to the node 320, a gate coupled to the node 356, and a drain coupled to the node 318. Similarly, in addition to the PMOS transistor 328, an NMOS transistor (not shown) may be coupled in parallel. The NMOS transistor may include a source coupled to the node 318, a gate coupled to the node 350, and a drain coupled to the node 324.

Figure 4:
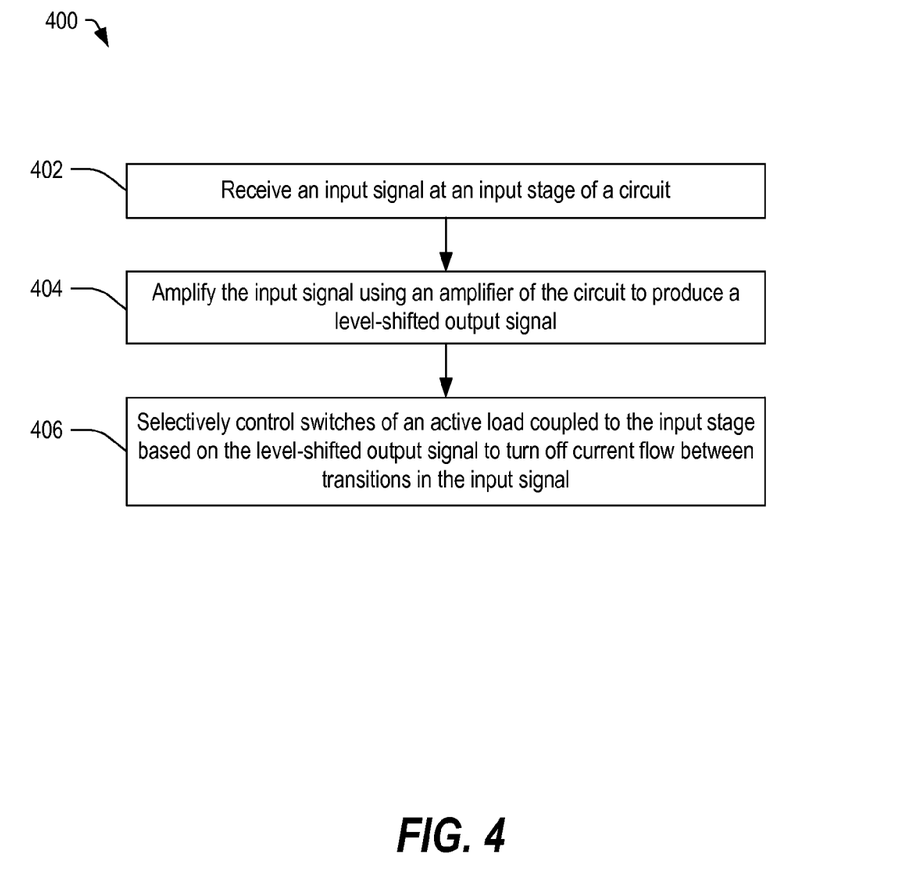
FIG. 4 is a flow diagram of a method of selectively configuring an active load, in accordance with certain embodiments.

FIG. 4 is a flow diagram of a method 400 of selectively configuring an active load, in accordance with certain embodiments. At 402, an input signal is received an input stage of a circuit. The input signal may be a single-ended input signal or a differential input signal.

Advancing to 404, the input signal may be amplified using an amplifier of the circuit to produce a level-shifted output signal. The input signal may be amplified using a differential amplifier configuration with either a single-ended input (where an inverted version of the input signal may be used as the second input) or a differential input. In some embodiments, the amplifying the input signal may include amplifying the input signal via a first amplifier stage to produces a first scaled voltage, converting the input signal using an inverter circuit to produce a second scaled voltage, and inverting the second scaled voltage to produce the level-shifted output signal. In some embodiments, amplifying the input signal may include applying the input signal to a gate of a first transistor coupled to the active load, applying an inverted version of the input signal to a gate of a second transistor coupled to the active load and to a gate of a third transistor, and applying a drain voltage of the first transistor to a gate of a fourth transistor having a source coupled to the active load and a drain coupled to a drain of the third transistor. In certain embodiments, the method may also include inverting a voltage at drain of the fourth transistor using a first inverter to produce a negative output voltage and inverting the negative output voltage at the output of the first inverter using a second inverter to produce a positive output voltage.

Continuing to 406, the switches of an active load coupled to the input stage are selectively controlled based on the level-shifted output signal to turn off current flow between transitions in the input signal. In some embodiments, the active load may provide current to the input stage in response to transitions in the input signal and may disable current to the input stage between transitions.

In some embodiments, in a first mode, selectively controlling the switches may include activating a first switch to couple a gate of a first transistor to a drain of the first transistor and deactivating a second switch to decouple a gate of a second transistor from a drain of the second transistor. In some embodiments, in a second mode, selectively controlling the switches may include deactivating the first switch to decouple the gate of the first transistor from the drain of the first transistor and activating the second switch to couple the gate of the second transistor to the drain of the second transistor.

In conjunction with the circuits and methods described above, a circuit may include an active load circuit that may be configured to selectively disable current flow to an input stage between transitions of an input signal and to allow current flow to the input stage when the input signal transitions. In some embodiments, the active load may include a current mirror circuit having a dynamically configured switch circuit that selectively diode connects one of the transistors of the current mirror based on a voltage level of an output signal. The diode connected transistor may be coupled in series with another transistor that is turned off, such that current cannot flow through the current flow path. Thus, current does not flow through the current mirror, and power is not dissipated through the active transistor at the input.

It should be appreciated that the illustrated embodiments are provided for illustrative purposes only, and that P-channel MOSFETs, N-Channel MOSFETs, or any combination thereof may be used. In some embodiments, the MOSFETs may be replaced with bipolar junction transistors.

Although the present invention has been described with reference to preferred embodiments, workers skilled in the art will recognize that changes may be made in form and detail without departing from the scope of the invention.

What is claimed is:

1. A method comprising:
   receiving an input signal at an input stage of a circuit;
   amplifying the input signal using an amplifier of the circuit to produce a level-shifted output signal; and
   selectively controlling switches of an active load coupled to the input stage based on the level-shifted output signal to provide current flow to the input stage during transitions of the input signal and to turn off the current flow to the input stage between the transitions in the input signal to reduce overall current consumption.

2. The method of claim 1, wherein amplifying the input signal comprises:
   amplifying the input signal via a first amplifier stage to produce a first scaled voltage;
   converting the input signal using an inverter circuit to produce a second scaled voltage; and
   inverting the second scaled voltage to produce the level-shifted output signal.

3. The method of claim 1, wherein amplifying the input signal comprises:
   applying the input signal to a gate of a first transistor coupled to the active load;
   applying an inverted version of the input signal to a gate of a second transistor coupled to the active load and to a gate of a third transistor; and
   applying a drain voltage of the first transistor to a gate of a fourth transistor having a source coupled to the active load and a drain coupled to a drain of the third transistor.

4. The method of claim 3, further comprising:
   inverting a voltage at drain of the fourth transistor using a first inverter to produce a negative output voltage; and
   inverting the negative output voltage at the output of the first inverter using a second inverter to produce a positive output voltage.

5. The method of claim 1, wherein selectively controlling the switches comprises:
   in a first mode, activating a first switch to couple a gate of a first transistor to a drain of the first transistor; and
   deactivating a second switch to decouple a gate of a second transistor from a drain of the second transistor.

6. The method of claim 5, wherein selectively controlling the switches comprises:
   in a second mode, deactivating the first switch to decouple the gate of the first transistor from the drain of the first transistor; and
   activating the second switch to couple the gate of the second transistor to the drain of the second transistor.

7. A circuit comprising:
   an output node;
   an input stage including at least one input to receive an input signal, and including at least one output;
   an active load coupled to the input stage and to the output node, the active load configured to selectively supply current to the input stage in response to transitions within the input signal and to disable current to the input stage between the transitions in the input signal.

8. The circuit of claim 7, wherein the active load includes a plurality of switches coupled to the input stage, at least one of the plurality of switches configured to toggle based on a signal at the output node.

9. The circuit of claim 7, further comprising at least one inverter coupled between the input stage and the output node.

10. The circuit of claim 7, wherein:
    the at least one input comprises a first input and a second input; and
    the input signal comprises a differential input signal.

11. The circuit of claim 7, wherein the active load comprises:
    a first transistor including a source coupled to a power supply node, a gate, and a drain coupled to the input stage;
    a second transistor including a source coupled to the power supply node, a gate, and a drain coupled to the input stage;
    a third transistor including a source coupled to the drain of the first transistor, a gate coupled to the output node to receive an output signal, and a drain coupled to the gates of the first and second transistors; and a fourth transistor including a source coupled to the drain of the second transistor, a gate configured to receive an inverted version of the output signal, and a source coupled to the gates of the first and second transistors.

12. The circuit of claim 11, wherein the input stage comprises:
a first input transistor including a drain coupled to the drain of the first transistor, a gate configured to receive an input signal, and a source coupled to a second power supply node;
a second input transistor including a drain coupled to the drain of the second transistor, a gate, and a source coupled to the second power supply node; and
an inverter including an input coupled to the gate of the first input transistor and an output coupled to the gate of the second input transistor.

13. The circuit of claim 12, further comprising:
a fifth transistor including a source coupled to the drain of the second transistor, a gate coupled to the drain of the first input transistor, and a drain coupled to a node;
a third input transistor including a drain coupled to the node, a gate coupled to the gate of the second input transistor, and a source coupled to the second power supply node; and
a second inverter including an input coupled to the node and including an output coupled to a first output node that is coupled to the gate of the fourth transistor.

14. The circuit of claim 13, further comprising a third inverter including an input coupled to the first output node and including an output coupled to the output node.

15. A circuit comprising:
a first output node and a second output node;
an input stage including at least one input to receive an input signal and including an output;
at least one converter circuit coupled to the output of the input stage and including a first output coupled to the first output node and a second output coupled to the second output node; and
an active load coupled to the input stage and responsive to signals at the first output node and the second output node to selectively disable current to the input stage.

16. The circuit of claim 15, wherein the active load provides current to the input stage when the input signal transitions and selectively disables current to the input stage between transitions in the input signal.

17. The circuit of claim 15, wherein:
the input signal includes a first input signal and a second input signal; and
the input stage comprises:
a first transistor including a drain coupled to the active load, a gate to receive the first input signal, and a source coupled to a power supply node; and
a second transistor including a drain coupled to the active load, a gate to receive the second input signal, and a source coupled to the power supply node.

18. The circuit of claim 17, wherein the active load comprises:
a current mirror circuit including:
a third transistor including a source coupled to a power supply node, and including a gate, and a drain coupled to a drain of the first transistor; and
a fourth transistor including a source coupled to the power supply node, and including a gate coupled to the gate of the third transistor, and including a drain coupled to a drain of the second transistor; and
a switching circuit including:
a fifth transistor including a source coupled to the drain of the third transistor, a gate coupled to the first output node, and a drain coupled to the gate of the third transistor; and
a sixth transistor including a source coupled to the drain of the fourth transistor, a gate coupled to the second output node, and a drain coupled to the gate of the third transistor.

19. The circuit of claim 15, wherein the active load comprises:
a first transistor including a source, a gate and a drain, the source coupled to a power supply node, the drain coupled to the input stage;
a second transistor including a source, a gate and a drain, the source coupled to the power supply node, the drain coupled to the input stage;
a third transistor including a source, a gate, and a drain, the source coupled to the drain of the first transistor, the gate coupled to the first output node, and the drain coupled to the gates of the first and second transistors; and
a fourth transistor including a source, a gate, and a drain, the source coupled to the drain of the first transistor, the gate coupled to the second output node, and the drain coupled to the gates of the first and second transistors; and
wherein the third transistor and the fourth transistor cooperate to selectively turn off current flow between transitions within the input signal.

20. The circuit of claim 15, wherein the input stage, the active load, and the at least one converter comprise a plurality of transistors, and wherein the plurality of transistors may be selected to be low voltage transistors or high voltage transistors.

* * * * *